United States Patent
Czettl et al.

(10) Patent No.: US 11,104,999 B2
(45) Date of Patent: Aug. 31, 2021

(54) COATED TOOL

(71) Applicant: CERATIZIT AUSTRIA GESELLSCHAFT M.B.H., Reutte (AT)

(72) Inventors: Christoph Czettl, Reutte (AT); Josef Thurner, Reutte (AT); Markus Lechleitner, Reutte (AT); Christian Jaeger, Reutte (AT)

(73) Assignee: CERATIZIT Austria Gesellschaft m.b.H., Reutte (AT)

( * ) Notice: Subject to any disclaimer, the term of this patent is extended or adjusted under 35 U.S.C. 154(b) by 0 days.

(21) Appl. No.: 16/477,608

(22) PCT Filed: Jan. 23, 2018

(86) PCT No.: PCT/AT2018/000002
§ 371 (c)(1),
(2) Date: Jul. 12, 2019

(87) PCT Pub. No.: WO2018/140990
PCT Pub. Date: Aug. 9, 2018

(65) Prior Publication Data
US 2020/0123664 A1 Apr. 23, 2020

(30) Foreign Application Priority Data
Jan. 31, 2017 (AT) ................. GM 25/2017

(51) Int. Cl.
*C23C 28/04* (2006.01)
*C23C 28/00* (2006.01)
(Continued)

(52) U.S. Cl.
CPC ............ *C23C 28/34* (2013.01); *C23C 16/342* (2013.01); *C23C 16/38* (2013.01); *C23C 28/044* (2013.01);
(Continued)

(58) Field of Classification Search
CPC ....... B23B 27/14; C23C 16/34; C23C 16/342; C23C 16/38; C23C 28/044; C23C 28/44; C22C 29/08
(Continued)

(56) References Cited

U.S. PATENT DOCUMENTS 4,237,184 A * 12/1980 Gonseth ................ B23B 27/148
428/336
7,267,701 B2 9/2007 Holzschuh
(Continued)

FOREIGN PATENT DOCUMENTS

AT 15143 U1 1/2017
DE 10222347 A1 10/2002
(Continued)

OTHER PUBLICATIONS

Nina Schalk, et al.; "Investigation of the origin of compressive residual stress in CVD TiB2 hard coatings using synchrotron X-ray nanodiffraction"; Surface & Coating Technology; Jun. 24, 2014; Elsevier.
(Continued)

*Primary Examiner* — Archene A Turner
(74) *Attorney, Agent, or Firm* — Laurence A. Greenberg; Werner H. Sterner; Ralph E. Locher

(57) ABSTRACT

A coated tool has a substrate and a hard material coating deposited on the substrate. The hard material coating has a layer structure in the following order, starting from the substrate: a titanium nitride layer, a titanium boron nitride transition layer, and a titanium diboride layer. The titanium boron nitride transition layer has a boron content that increases from the titanium nitride layer in the direction of the titanium diboride layer. The boron content does not exceed 15 at %.

20 Claims, 3 Drawing Sheets

(51) Int. Cl.
  *C23C 16/34* (2006.01)
  *C23C 16/38* (2006.01)
  *B23C 5/00* (2006.01)
  *C22C 29/08* (2006.01)

(52) U.S. Cl.
  CPC .............. *C23C 28/44* (2013.01); *B23C 5/006* (2013.01); *C22C 29/08* (2013.01)

(58) Field of Classification Search
  USPC .................................... 428/698; 51/307, 309
  See application file for complete search history.

(56) References Cited

U.S. PATENT DOCUMENTS

| | | | |
|---|---|---|---|
| 8,293,359 B2* | 10/2012 | Kathrein | ................ C23C 16/34 428/216 |
| 8,388,709 B2 | 3/2013 | Wallgram et al. | |
| 2003/0039867 A1* | 2/2003 | Berger | ................ C23C 30/005 428/704 |
| 2004/0016329 A1 | 1/2004 | Holzschuh | |
| 2019/0119794 A1 | 4/2019 | Toufar et al. | |
| 2019/0224221 A1* | 7/2019 | Han | ................ A61K 47/551 |

FOREIGN PATENT DOCUMENTS

| | | | |
|---|---|---|---|
| EP | 1245693 | A1 | 10/2002 |
| EP | 2209929 | B1 | 8/2013 |
| EP | 2959994 | A1 | 12/2015 |
| FR | 2370551 | A1 | 6/1978 |
| JP | 2002-355704 | * | 12/2002 |
| JP | 2011-083876 | * | 4/2011 |
| JP | 2012-139795 | * | 7/2012 |
| WO | 2004101455 | A1 | 11/2004 |
| WO | 2009070820 | A1 | 6/2009 |
| WO | 2010050877 | A1 | 5/2010 |

OTHER PUBLICATIONS

J. Keckes, et al.; "X-ray nanodiffraction reveals strain and microstructure evolution in nanocrystalline thin films"; SciVerse ScienceDriect; Jul. 31, 2012; pp. 748-751; Elsevier.

Eric J. Mittemeijer, et al.; "The "state of the art" of the diffraction analysis of crystallite size and lattice strain"; Zeitschrift für Kristallographie; 2018; pp. 552-560; Oldenbourg Wissenschaftsverlag.

* cited by examiner

COATED TOOL

BACKGROUND OF THE INVENTION

Field of the Invention

The present invention relates to a coated tool comprising a substrate and a hard material coating which has been deposited on the substrate and comprises, inter alia, a fine-grained titanium diboride layer.

In particular in the cutting machining of metallic materials, not only uncoated tools made of, for example, cemented hard material or cement but also coated tools in the case of which a hard material coating has been deposited on the tool body forming a substrate in order to improve the wear resistance and cutting properties of the tool further have been used for many years. The tool can, for example, be formed in one piece from the substrate material with a shaft for connection to a cutting machine, for example as a solid cemented hard material tool, but it can, in particular, also preferably be configured as an exchangeable cutting insert which can be fastened in an exchangeable manner to a tool main element.

Cemented hard material and cement are each composite materials in which hard material particles, which form the predominant constituent of the composite material, are embedded in a ductile metallic binder which forms a significantly smaller proportion of the composite material. At least in the case of a high proportion of hard material particles, the composite material has a skeleton or framework structure which is formed by the hard material particles and the interstices of which are filled by the ductile metallic binder. The hard material particles can, in particular, be formed at least predominantly by tungsten carbide, titanium carbide and/or titanium carbonitride, with, for example, other hard material particles, in particular carbides of the elements of groups IV to VI of the Periodic Table of the Elements, additionally being able to be present in smaller amounts. The ductile metallic binder usually consists at least predominantly of cobalt, nickel, iron or an alloy based on at least one of these elements. However, other elements can also be dissolved in smaller amounts in the metallic binder. For the present purposes, when an alloy is based on an element, this means that this element forms the predominant constituent of the alloy. Cemented hard material in which the hard material particles are formed at least predominantly by tungsten carbide and the metallic binder is a cobalt-based or cobalt-nickel-based alloy is most frequently used.

EP 2 209 929 B1 describes a tool for cutting machining comprising a substrate material and a hard material coating which has been deposited on the substrate material and comprises a titanium diboride layer having a very fine-grained microstructure which has been deposited by means of a thermal CVD process.

In "Investigation of the origin of compressive residual stress in CVD $TiB_2$ hard coatings using synchrotron X-ray nanodiffraction" by N. Schalk et al. in Surface and Coatings Technology, Vol. 258, 2014, pp. 121-126, it is stated under "Experimental methods" how, inter alia, stress states in hard material coatings can be determined by means of synchrotron studies.

SUMMARY OF THE INVENTION

It is an object of the present invention to improve the layer adhesion of a fine-grained titanium diboride layer in a tool further and make further-improved operation of a coated tool possible.

The object is achieved by a coated tool as claimed. Advantageous further developments are indicated in the independent claims.

The coated tool has a substrate and a hard material coating deposited on the substrate. The hard material coating has, starting from the substrate, a layer structure in the following order: a titanium nitride layer, a titanium boronitride transition layer and a titanium diboride layer. The titanium boronitride transition layer has a boron content which increases from the titanium nitride layer in the direction of the titanium diboride layer. The boron content of the titanium boronitride layer does not exceed 15 at.-%.

The titanium boronitride transition layer having a boron content which increases in the direction of the titanium diboride layer leads to a significant improvement in the layer adhesion of the hard material coating. In particular, a disadvantageous large step change in the residual stresses in the hard material coating at the boundary to the titanium diboride layer is avoided. Since the boron content of the titanium boronitride transition layer does not exceed a value of 15 at.-%, even close to the titanium diboride layer, formation of phases having a hexagonal crystal structure, which would have an adverse effect on the properties of the hard material coating, is reliably avoided in the titanium boronitride transition layer. It should be noted that although the titanium nitride layer can have an exactly stoichiometric composition, this is not absolutely necessary. The ratio between titanium and nitrogen in the titanium nitride layer can also deviate from the stoichiometric ratio; in particular, the titanium nitride layer can have a composition $TiN_x$ such that $0.95 \leq x \leq 1.05$. A small deviation from the exactly stoichiometric ratio can also be present in the titanium diboride layer. In the titanium boronitride transition layer, the nitrogen content decreases with increasing boron content, i.e. with increasing distance from the titanium nitride layer. In this layer, too, the ratio between titanium and nitrogen/boron is not necessarily exactly stoichiometric, but can also be slightly superstoichiometric or substoichiometric. The boron content in the various regions of the titanium boronitride transition layer can be determined reliably by means of, for example, GDOES (glow discharge optical emission spectroscopy). The boron content of the titanium boronitride layer preferably increases to at least 2 at.-%, preferably at least 5 at.-%, in the direction of the titanium diboride layer. It should be noted that although the titanium diboride layer can form the outermost layer of the hard material coating, it is also possible for one or more further layers to be deposited on the titanium diboride layer, e.g. in particular a titanium nitride covering layer.

In one further development, the titanium boronitride transition layer has a layer thickness of 0.1-4.0 µm. In this case, a very good transition of the stress states in the various layers of the hard material coating is firstly made possible, which would not be achieved with a relatively thin layer thickness, and secondly the titanium boronitride transition layer is still sufficiently thin for an impairment of the hard material coating due to an excessive thickness to be reliably avoided. The titanium boronitride transition layer can preferably have a layer thickness of 0.2-2.0 µm.

In one further development, the boron content of the titanium boronitride transition layer increases in steps. In this case, the increase in the boron content from the titanium nitride layer in the direction of the titanium diboride layer can be set particularly simply and reliably from a process engineering point of view and the formation of hexagonal phases in the titanium boronitride transition layer can be reliably avoided.

In one further development, the titanium nitride layer has a layer thickness of 0.1-2.0 µm. In this case, particularly good bonding of the hard material coating to the substrate is achieved and, in particular, the formation of a boron-containing diffusion zone at the surface of the substrate can also be reliably prevented. The titanium nitride layer can preferably have a layer thickness of 0.3-1.5 µm.

In one further development, the titanium diboride layer has a layer thickness of 0.2-15.0 µm. The layer thickness of the titanium diboride layer can be advantageously optimized in this range according to the material to be machined and the desired machining conditions. The titanium diboride layer can preferably have a layer thickness of 1.0-10.0 µm.

In one further development, the titanium diboride layer has residual stresses in the range −2.5±2 GPa, preferably in the range −2.5±1 GPa. The residual stresses in the titanium diboride layer can be determined in a generally known manner by X-ray diffraction using the $\sin^2\psi$ measurement method, as is described in the publication by N. Schalk et al. in Surface and Coatings Technology, Vol. 258, 2014, pp. 121-126, cited above with the further references indicated there. The following values were used for calculating the residual stresses: modulus of elasticity 565 GPa, Poisson's ratio 0.108 (see Journal of research of NIST vol 105 no 5 2000). When the residual stresses of the titanium diboride layer are in this range, particularly good stability of the hard material coating, which is, in particular, particularly well-suited to cutting machining of titanium alloys and other nonferrous alloys, is achieved.

In one further development, the titanium diboride layer has a hardness of >40 GPa. The hardness of the titanium diboride layer can, in particular, preferably be in the range 40-50 GPa. The hardness can be reliably determined by means of, in particular, nanoindentation using a Berkovich indenter made of diamond.

In a further development, the coated tool is a cutting tool for titanium alloys and/or other nonferrous alloys. In this case, the hard material coating of the invention displays particularly distinct advantages over conventional coatings. The coated tool can preferably be configured as cutting tool for titanium alloys.

In one further development, the substrate is a cemented hard material comprising a hard material phase which consists predominantly of tungsten carbide and a binder phase whose main constituent in percent by weight is cobalt. In this case, the combination of substrate and hard material coating is particularly well-suited for cutting tools. The substrate can comprise not only tungsten carbide but also further, other hard material particles in smaller amounts, in particular, for example, cubic carbides of elements of groups IV to VI of the Periodic Table of the Elements. The binder phase can comprise not only cobalt but also further constituents, and can thus be, in particular, a cobalt-based alloy. It is also possible for, in particular, chromium, molybdenum, ruthenium and further metals, for example, to be present in the binder phase in addition to tungsten from the hard material phase.

In one further development, the binder phase makes up 5-17% by weight of the cemented hard material. The amount of the binder phase can advantageously be matched in each case to the material to be machined by means of the tool and the machining parameters.

In one further development, the binder phase comprises ruthenium in a proportion of 6-16% by weight of the binder phase. The combination of, in particular, a cemented hard material having such a composition as substrate and the indicated hard material coating has been found to be particularly suitable for cutting machining of, in particular, titanium alloys.

In one further development, an interface of the substrate to the hard material coating is free of η phase and substantially free of boron. In the technical field of cemented hard material (cemented carbide), η phase is complex carbides of, in particular, cobalt and tungsten which form, in particular, under highly carbon-deficient conditions and lead to undesirable embrittlement of the cemented hard material. A boron-containing diffusion zone in the outer region of the substrate would likewise have an adverse effect on the layer adhesion and consequently on the operating life of the coated tool.

In one further development, a covering layer is formed on the titanium diboride layer. The formation of such a covering layer can, in particular, advantageously allow simplified recognition of the state of wear of the tool. The covering layer can preferably be a carbide, nitride, oxide, carbonitride, oxynitride or carbooxynitride of at least one of the elements Ti, Zr, Hf, so that the properties of the coated tool are not disadvantageously influenced.

In one further development, the titanium boronitride transition layer has a cubic crystal structure throughout. In this case, a deterioration in the layer adhesion, which would result from proportions of hexagonal phase in the titanium boronitride transition layer, is reliably prevented. The cubic crystal structure throughout can, for example, be reliably confirmed by means of TEM studies (Transmissions Electron Microscope), with a particularly finely resolved examination being able to be carried out by means of, for example, synchrotron measurements. How such synchrotron measurements are appropriately carried out is described, for example, in "X-ray nanodiffraction reveals strain and microstructure evolution in nanocrystalline thin films" by J. Keckes et al. in Scripta Materialia 67 (2012) 748-751.

In one further development, the titanium diboride layer has a fine-grained microstructure having an average crystallite size of less than 50 nm. The determination of such a fine-grained state can, in particular, be carried out using a Bruker D8 Advance X-ray diffractometer in the locked-coupled mode using copper Kα radiation in a θ-2θ scan in parallel beam geometry with 0.02° step width and 1.2 seconds counting time over an angle range of 20°-80°. As is generally known to a person skilled in the art, the width at half height of the clearly measurable reflections correlates with the average crystallite size. To determine the fineness of the grains of the titanium diboride layer having an average crystallite size of less than 50 nm, use is made of the width at half height (FWHM) of the (101) reflection of titanium diboride after correction of the instrumental broadening, which has to be at least 0.5°, preferably in a range of 0.5°-2°. The determination of the average crystallite size by means of the width at half height is comprehensively described in "The "state of the art" of the diffraction analysis of crystallite size and lattice strain" by E. Mittemeijer et al. in Z. Kristallogr. 223 (2008) 552-560. For this purpose, it is possible to use commercial software packets, such as the Topas 4.2 software from Bruker in the example described. This extremely fine-grained nature leads to a particularly smooth surface of the titanium diboride layer, so that virtually no adhesion of swarf to the surface occurs even in the machining of difficult-to-machine materials, in particular titanium alloys.

In one further development, the hard material coating has been deposited by means of a thermal CVD process. The coating can, in particular, typically be deposited at temperatures in the range from about 850° C. to about 1050° C. The higher temperatures used in a thermal CVD process (chemical vapor deposition) have, compared to, for example, deposition in a PA-CVD (plasma-assisted CVD) working at lower temperatures, the advantage of a substantially better resulting layer adhesion.

The object is also achieved by the use of the coated tool for cutting machining of titanium alloys and/or other nonferrous alloys as claimed in claim 17.

Further advantages and useful aspects of the invention are indicated with the aid of the following description of working examples with reference to the accompanying figures.

EXEMPLARY EMBODIMENT OF THE INVENTION

Figure 1:
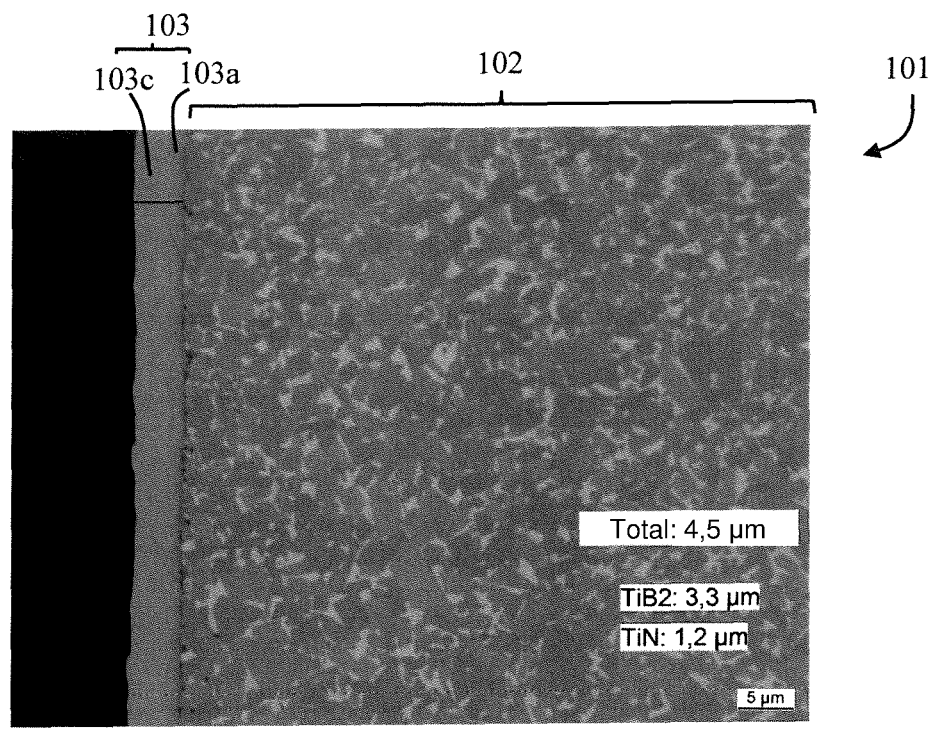
FIG. 1: a metallographic polished section of a coated tool having a hard material coating deposited on a substrate as per a comparative example.

An embodiment will be described in detail below with reference to the accompanying figures.

The coated tool 1 as per the embodiment is designed as a cutting tool for the cutting machining of materials, in particular of titanium alloys and/or other nonferrous alloys. In the specific example which follows, the coated tool is configured in the form of an exchangeable cutting insert which can be fastened exchangeably to a tool main element. However, it is also possible, for example, to form the coated tool in one piece with a clamping section for connection to a tool chuck, in particular, for example, as a solid cemented hard material tool.

The coated tool 1 comprises a substrate 2 and a multilayer hard material coating 3 deposited on the substrate 2. In the specific example shown, the substrate 2 is a cemented hard material having a hard material phase 4 formed predominantly by tungsten carbide and a binder phase 5 whose main constituent is cobalt. The binder phase 5 is, in the specific example, a cobalt-based alloy which makes up a proportion of 5-17% by weight of the substrate 2. In a particularly preferred variant, the binder phase 5 is a cobalt-based alloy which comprises not only cobalt but at least also ruthenium in a proportion of 6-16% by weight of the binder phase.

The hard material coating 3 has a multilayer structure in which a titanium nitride layer 3a, which has a layer thickness in the range 0.1-2.0 µm, is formed directly on the substrate 2, with a layer thickness in the range 0.3-1.5 µm being preferred. The titanium nitride layer 3a has, in a known manner, a cubic crystal structure. The interface of the substrate 2 to the hard material coating 3 is free of η phase and substantially free of boron.

A titanium boronitride transition layer 3b, whose boron content increases with increasing distance from the titanium nitride layer 3a and whose nitrogen content correspondingly decreases with increasing distance from the titanium nitride layer 3a, is formed on the titanium nitride layer 3a. The titanium boronitride transition layer 3b has a layer thickness of 0.1-4.0 µm, with the layer thickness preferably being able to be 0.2-2.0 µm. In the specific working example, the boron content of the titanium boronitride transition layer 3b increases stepwise in a plurality of steps with increasing distance from the titanium nitride layer 3a. This stepwise increase in the boron content of the titanium boronitride transition layer 3b can be realized in a simple way in the deposition of the titanium boronitride transition layer 3b by changing the process gas atmosphere in a thermal CVD process, as will be described in more detail. The titanium boronitride transition layer 3b has a very low boron content, which in the embodiment is significantly less than 5 at.-%, in a region directly adjoining the titanium nitride layer 3a. As indicated above, the boron content of the titanium boronitride transition layer 3b increases with increasing distance from the titanium nitride layer 3a, but does not exceed a boron content of 15 at.-% in the region farthest away from the titanium nitride layer 3a. Apart from the particularly preferred stepwise increase in the boron content, which can occur over a plurality of steps, e.g. from two and 16 steps, it is also possible, for example, to provide an essentially continuous increase of the boron content in the titanium boronitride transition layer 3b. In this case too, the boron content of the titanium boronitride transition layer 3b in the region farthest away from the titanium nitride layer 3a must not, however, exceed 15 at.-% in order to reliably avoid formation of hexagonal phases in the titanium boronitride transition layer 3b. The titanium boronitride transition layer 3b (i.e. the crystallites of the polycrystalline titanium boronitride transition layer 3b) thus has a cubic crystal structure throughout and is free of hexagonal phases, as can be confirmed by means of TEM measurements and synchrotron measurements. The titanium boronitride transition layer 3b has a hardness in the range 20-35 GPa, measured by means of nanoindentation using a Berkovich tester made of diamond, over its entire thickness. The hardness measurement is carried out using a nanoindenter which is equipped with a Berkovich tester made of diamond. A maximum load of 5 mN is used for the measurement. A Hysitron Triboindenter TI950 served as measuring instrument in the illustrative embodiment.

An extremely fine-grained titanium diboride layer 3c, which has an average crystalline size of less than 50 nm, is formed on the side of the titanium boronitride transition layer 3b facing away from the titanium nitride layer 3a. The titanium diboride layer 3c has a layer thickness in the range 0.2-15.0 µm. The titanium diboride layer 3c can preferably have a layer thickness in the range 1.0-10.0 µm. As in the case of the titanium nitride layer 3a and the titanium boronitride transition layer 3b, the layer thickness of the titanium diboride layer 3c can be controlled during deposition in a thermal CVD process, in particular via the respective coating time, with the layers being able to vary slightly in terms of their thickness in a manner known per se, e.g. depending on the position in the CVD reactor used for coating, etc. The titanium diboride layer 3c has, owing to its very fine-grained structure and the deposition conditions in a thermal CVD process at temperatures in the range from 850° C. to 1050° C., residual stresses in the range −2.5±2 GPa, preferably −2.5±1 GPa, which can be determined in a known manner by X-ray diffraction using the $\sin^2\psi$ measurement method. The titanium diboride layer 3c has a hardness of more than 40 GPa, in particular in the range 40-50 GPa, again measured by means of nanoindentation using a Berkovich tester made of diamond as described above. The hardness of the titanium diboride layer 3c is thus, in particular, significantly greater than the hardness of about 38 GPa of bulk titanium diboride material.

Owing to the restriction of the boron content of the titanium boronitride transition layer 3b, which prevents the formation of crystallites having a hexagonal crystal structure in the titanium boronitride transition layer 3b, the hard material coating 3 has a step change in the boron content at the transition from the titanium boronitride transition layer 3b to the titanium diboride layer 3c (from a boron content of not more than 15 at.-% in the titanium boronitride transition layer 3b to a boron content of about 66 at.-% in the titanium diboride layer 3c). Owing to this step increase at the transition, the transition from the titanium boronitride transition layer 3b to the titanium diboride layer 3c can also be recognized as an interface in a metallographic hemispherical polished section, in which the hard material coating 3 is ground obliquely.

In the embodiment, the deposition of the hard material coating 3 on the substrate 2 was carried out in a commercial thermal CVD reactor on a production scale at deposition temperatures in the temperature window from 860° C. to 920° C.

The titanium nitride layer 3a was firstly deposited with the desired layer thickness in the range 0.3-1.5 μm on the substrate 2 in a manner known per se in a thermal CVD process, with the layer thickness being controlled via the coating time. The coating parameters which were used in the following example with an illustrative four-stage titanium boronitride transition layer 3b having the stages 3b.1, 3b.2, 3b.3 and 3b.4 may be found in the following table: The figures reported correspond to the amounts (in % by volume) of the precursor in the gaseous state. The temperatures and process pressures used are likewise reported in table 1. The total gas flow and the coating time have to be matched in a known manner to the construction of the coating plant in order to achieve the desired layer thicknesses.

tents in at.-% achieved in the respective regions of the titanium boronitride layer produced in this way were subsequently determined by means of GDOES depth profile measurements, were performed. Furthermore, the respective regions of the titanium boronitride layer produced in this way were examined for the presence of hexagonal phase by means of TEM studies and SAED (selected area electron diffraction). In these studies, it was established that hexagonal phase occurred in the titanium boronitride layer above a boron content of 15 at.-% and this hexagonal phase had adverse effects on the hardness and the layer adhesion of the hard material coating.

EXAMPLE

Figure 3:
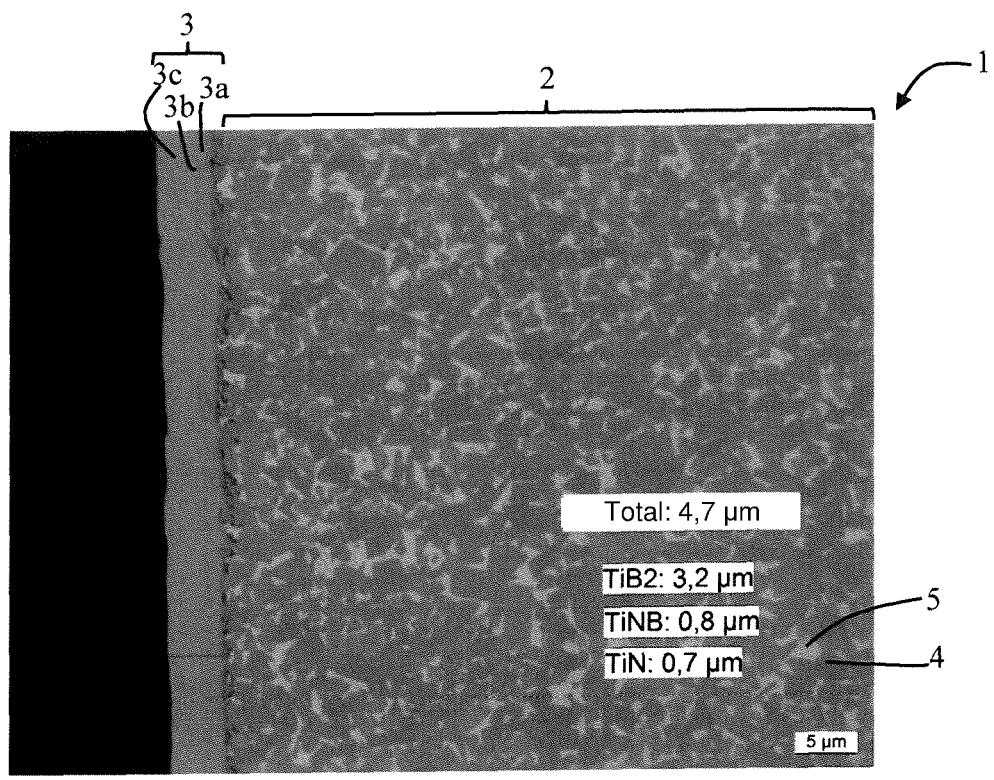
FIG. 3: a metallographic polished section of a coated tool as per an embodiment.
Figure 4:
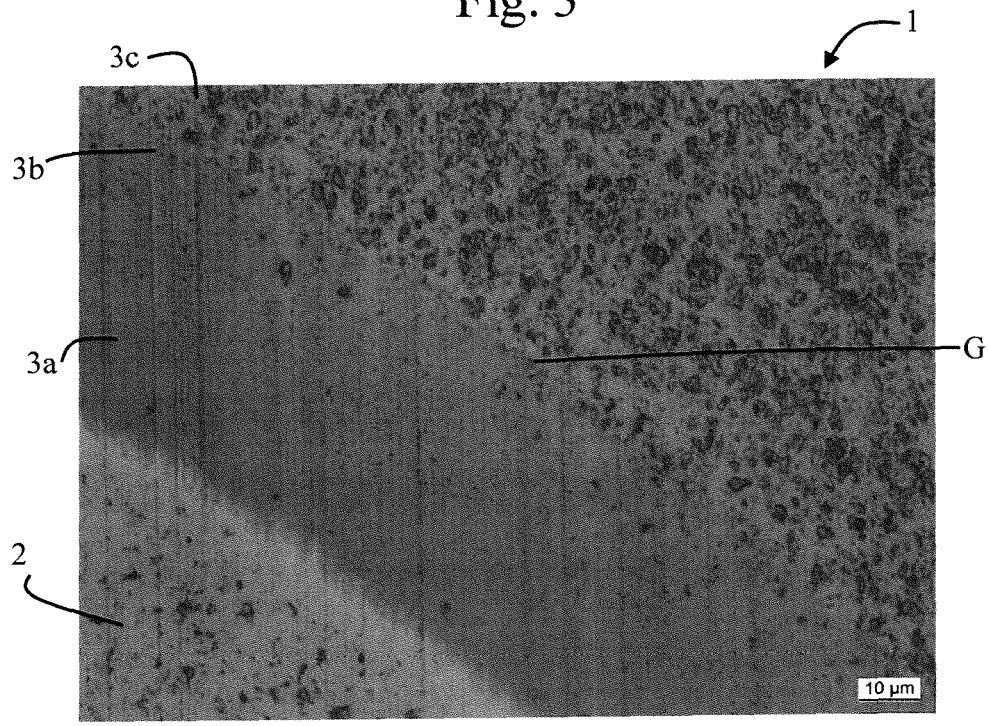
FIG. 4: a metallographic hemispherical polished section of the coated tool as per the embodiment.

In order to produce a coated tool 1, an exchangeable cutting insert for the cutting machining of titanium alloys was coated with the hard material coating 3 according to the invention, as described in more detail with the aid of FIG. 3 and FIG. 4. The cutting insert serving as substrate 2 consisted of a commercial cemented hard material produced by the applicant and having a composition of 10% by weight of cobalt, 1.5% by weight of ruthenium, tungsten carbide as balance and an average grain size of the tungsten carbide grains in the range 1.3-2.5 μm.

A titanium nitride layer 3a having a layer thickness of 0.7 μm was firstly deposited on this substrate 2.

On top of this titanium nitride layer 3a, an approximately 0.8 μm thick titanium boronitride transition layer 3b having a boron content which increased in steps with increasing distance from the titanium nitride layer 3a was subsequently deposited at about 880° C. The boron content in the titanium boronitride transition layer 3b was set by changing the flow of $BCl_3$ into the reactor in steps from 0.08% by volume, via 0.13% by volume and 0.17% by volume to 0.21% by volume, as a result of which a titanium boronitride transition

TABLE 1

| | $H_2$ [%] | Ar [%] | $N_2$ [%] | $BCl_3$ [%] | $TiCl_4$ [%] | T [° C.] | P [mbar] |
|---|---|---|---|---|---|---|---|
| TiN (3a) | Balance | — | 44 | 0 | 2 | 920 | 900 |
| TiNB_1 (3b.1) | Balance | — | 44 | 0.08 | 1.27 | 880 | 900 |
| TiNB_2 (3b.2) | Balance | — | 44 | 0.13 | 1.27 | 880 | 900 |
| TiNB_3 (3b.3) | Balance | — | 44 | 0.17 | 1.27 | 880 | 900 |
| TiNB_4 (3b.4) | Balance | — | 44 | 0.21 | 1.27 | 880 | 900 |
| $TiB_2$ (3c) | Balance | 80 | — | 1.62 | 0.80 | 860 | 900 |

The titanium boronitride transition layer 3b was deposited with a stepwise increase in the boron content on top of the previously deposited titanium nitride layer 3a. In order to achieve the stepwise increase in the boron content in the titanium boronitride transition layer 3b, the flow of $BCl_3$ through the reactor was increased in steps, in a specific variant from initially 0.08% by volume, via 0.13% by volume of $BCl_3$ and 0.17% by volume of $BCl_3$ to a maximum value of 0.21% by volume of $BCl_3$, by means of which a boron content in the outermost region of the titanium boronitride transition layer 3b of about 14 at.-% was achieved.

In order to determine the required boron content in the titanium boronitride transition layer 3b at which a good stress transition can be achieved but hexagonal phase does not yet occur in the titanium boronitride transition layer 3b, preliminary tests with a stepwise increase in the introduction of $BCl_3$ into the reactor, in which the amounts of $BCl_3$ were increased to significantly higher values and the boron conlayer 3b having a boron content which varied over four stages was achieved. The respective coating time was selected so that the four stages of the titanium boronitride transition layer 3b each had an essentially equal thickness of about 0.2 μm. The titanium boronitride transition layer 3b had a hardness which varied slightly over its thickness from 20 GPa to 35 GPa.

On top of the titanium boronitride transition layer 3b, a very fine-grained titanium diboride layer 3c was subsequently deposited in a layer thickness of about 3.2 μm. An optical micrograph of a polished section of the coated tool 1 with a magnification of 1000x can be seen in FIG. 3. The boron content of the titanium boronitride transition layer 3b in the respective stages was about 4 at.-%, about 8 at.-%, about 11 at.-% and in the outermost stage about 14 at.-%, as determined by means of GDOES measurements. Furthermore, the outer zone of the substrate 2 facing the hard material coating 3 was free of η phase and substantially free of boron.

As was likewise examined in detail by means of TEM measurements and synchrotron measurements after manufacture of the coated tool 1, the titanium boronitride transition layer 3b was free of hexagonal phase and only cubic phase could be found. The residual stresses in the titanium diboride layer 3c were determined by means of the $\sin^2\psi$ measurement method and were −2026±130 MPa in the example. The hardness of the titanium diboride layer 3c was 44 GPa.

A hemispherical polished section of the coated tool 1 as per the example is shown in FIG. 4. It can be seen that the layer adhesion is very good and the hard material coating overall is very uniform.

Figure 5:
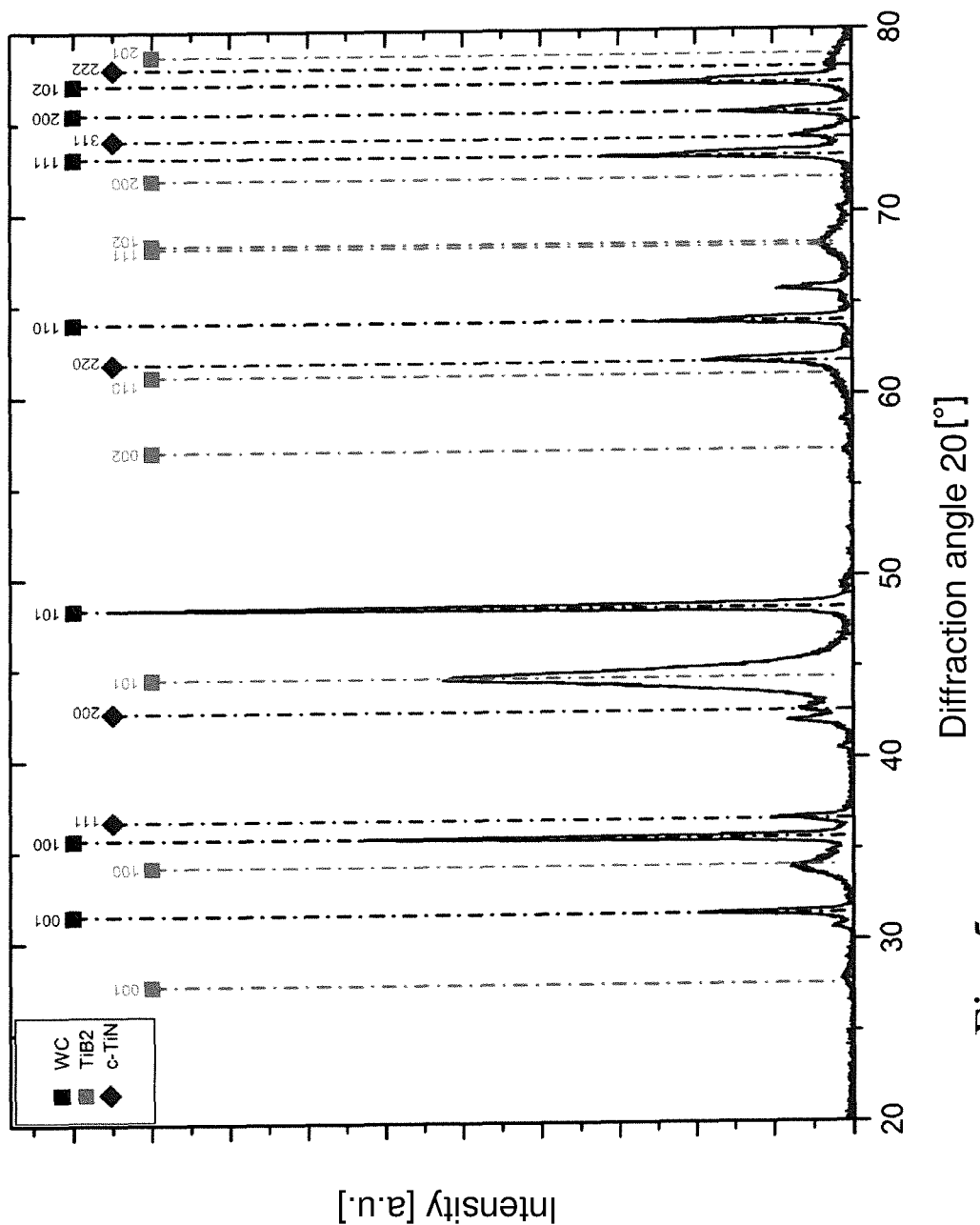
FIG. 5: an XRD diffraction pattern of the coated tool as per the embodiment.

An XRD (X-ray diffraction) pattern of the coated tool 1 as per the example is shown in FIG. 5. The measurement was carried out using a Bruker D8 Advance X-ray diffractometer in the locked-coupled mode using copper Kα radiation in a θ-2θ scan in parallel beam geometry with 0.02° step width and 1.2 seconds counting time over an angle range of 20°-80°. The titanium boride layer 3c has a very fine-grained microstructure having an average crystallite size of significantly below 50 nm. The width at half height (FWHM) of the (101) reflection of titanium diboride after Rietveld refinement was 0.8421°.

COMPARATIVE EXAMPLE

As comparative example, a coated tool 101 was produced by coating a cemented hard material substrate 102 corresponding to the above-described example (tungsten carbide, 10% by weight of cobalt, 1.5% by weight of ruthenium; average grain size of the tungsten carbide of 1.3-2.5 µm) with a known hard material coating 103.

A titanium nitride layer 103a having a layer thickness of about 1.2 µm was firstly formed on the substrate 102 in the same way as in the above-described example. A fine-grained titanium diboride layer 103c having a layer thickness of about 3.3 µm was subsequently deposited directly on this titanium nitride layer 103.

Figure 2:
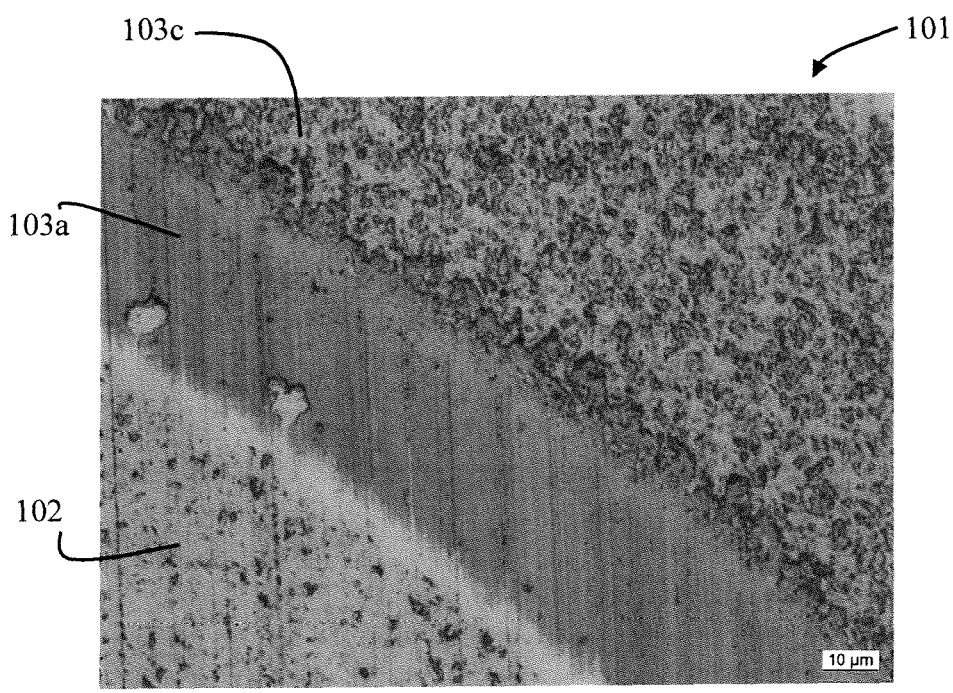
FIG. 2: a metallographic hemispherical polished section of the coated tool of FIG. 1.

An optical micrograph of a polished section of the coated tool 101 as per this comparative example with an enlargement of 1000x can be seen in FIG. 1. As can be seen from the hemispherical polished section of the coated tool 101 as per the comparative example in FIG. 2, the layer structure of the hard material coating 103 is significantly less uniform in the comparative example. As can be seen from isolated spalling arising during production of the hemispherical polished section, the layer adhesion of the hard material coating 103 is also significantly lower in the comparative example than the layer adhesion of the hard material coating 3 in the above-described example.

Further Developments

Should this be desired, for example, in order to make improved recognition of the state of wear of the hard material coating 3 possible, an additional covering layer can be formed on the titanium diboride layer 3c. The covering layer can, in particular, be a carbide, nitride, oxide, carbonitride, oxynitride or carbooxynitride of at least one of the elements Ti, Zr, Hf.

The invention claimed is:

1. A coated tool, comprising:
   a substrate; and
   a hard material coating deposited on said substrate, said the hard material coating having, starting from the substrate, a layer structure in the following order:
     a titanium nitride layer;
     a titanium boronitride transition layer; and
     a titanium diboride layer;
   said titanium boronitride transition layer having a boron content that increases from said titanium nitride layer in a direction towards said titanium diboride layer and does not exceed 15 at.-%.

2. The coated tool according to claim 1, wherein the titanium boronitride transition layer has a layer thickness of 0.1-4.0 µm.

3. The coated tool according to claim 2, wherein the layer thickness of said titanium boronitride transition layer is 0.2-2.0 µm.

4. The coated tool according to claim 1, wherein the boron content of said titanium boronitride transition layer increases in steps.

5. The coated tool according to claim 1, wherein said titanium nitride layer has a layer thickness of 0.1-2.0 µm.

6. The coated tool according to claim 5, wherein the layer thickness of said titanium nitride layer is 0.3-1.5 µm.

7. The coated tool according to claim 1, wherein said titanium diboride layer has a layer thickness of 0.2-15.0 µm.

8. The coated tool according to claim 7, wherein the layer thickness of said titanium diboride layer is 1.0-10.0 µm.

9. The coated tool according to claim 1, wherein said titanium diboride layer has compressive residual stresses in a range −2.5±2 GPa.

10. The coated tool according to claim 1, wherein said titanium diboride layer has a hardness of at least 40 GPa.

11. The coated tool according to claim 1, configured as a cutting machining tool for titanium alloys and/or other nonferrous alloys.

12. The coated tool according to claim 1, wherein said substrate is a cemented hard material comprising a hard material phase which consists predominantly of tungsten carbide and a binder phase with cobalt as a main constituent.

13. The coated tool according to claim 12, wherein said binder phase makes up 5-17% by weight of said cemented hard material.

14. The coated tool according to claim 12, wherein said binder phase comprises ruthenium in a proportion of 6-16% by weight of said binder phase.

15. The coated tool according to claim 1, wherein an interface of said substrate to said hard material coating is free of a η phase and is substantially free of boron.

16. The coated tool according to claim 1, further comprising a covering layer formed on said titanium diboride layer.

17. The coated tool according to claim 1, wherein said titanium boronitride transition layer has a cubic crystal structure throughout.

18. The coated tool according to claim 1, wherein said titanium diboride layer has a fine-grained microstructure with an average crystallite size of less than 50 nm.

19. The coated tool according to claim 1, wherein said hard material coating is a chemical vapor deposition (CVD) coating having been deposited by a thermal CVD process.

20. A method of cutting a titanium alloy or another nonferrous alloy, the method comprising: providing a coated tool according to claim 1 and machining the titanium alloy or nonferrous alloy.

* * * * *